United States Patent
Miyajima et al.

(10) Patent No.: US 10,112,324 B2
(45) Date of Patent: Oct. 30, 2018

(54) IMPRINT METHOD, IMPRINT APPARATUS, AND PRODUCTION METHOD FOR ARTICLE

(71) Applicant: CANON KABUSHIKI KAISHA, Tokyo (JP)

(72) Inventors: Yoshikazu Miyajima, Utsunomiya (JP); Yukio Takabayashi, Saitama (JP); Shinichi Shudo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 875 days.

(21) Appl. No.: 14/571,048

(22) Filed: Dec. 15, 2014

(65) Prior Publication Data

US 2015/0165650 A1    Jun. 18, 2015

(30) Foreign Application Priority Data

Dec. 18, 2013  (JP) ................. 2013-261509

(51) Int. Cl.
*B29C 33/72* (2006.01)
*G03F 7/00* (2006.01)

(52) U.S. Cl.
CPC ............ *B29C 33/72* (2013.01); *G03F 7/0002* (2013.01)

(58) Field of Classification Search
CPC .................................................. B29C 33/72
See application file for complete search history.

(56) References Cited

U.S. PATENT DOCUMENTS

2008/0145773 A1\* 6/2008 Wang .................... B29C 43/021
                                                                430/22
2012/0228789 A1\* 9/2012 Wakabayashi .......... B29C 59/02
                                                                264/39

FOREIGN PATENT DOCUMENTS

| JP | 2009-266841 A | 11/2009 |
| JP | 2013-229475 A | 11/2013 |
| KR | 10-2012-0102014 A | 9/2012 |
| WO | 2006/112062 A1 | 10/2006 |

\* cited by examiner

*Primary Examiner* — Larry W Thrower
(74) *Attorney, Agent, or Firm* — Canon USA, Inc. I.P. Division (57) ABSTRACT

An imprint method for forming a pattern on a substrate by using a mold includes carrying the substrate into an imprint apparatus, removing, after the substrate is carried into the imprint apparatus, a whole or a portion of foreign particles adhering to a pattern formed on the mold by bringing into contact the mold and an imprint material supplied to a member different from the substrate within the imprint apparatus, and curing the imprint material so as to form the pattern, and forming the pattern on the substrate that has carried into the imprint apparatus, by using the mold from which the foreign particles are removed.

5 Claims, 7 Drawing Sheets

IMPRINT METHOD, IMPRINT APPARATUS, AND PRODUCTION METHOD FOR ARTICLE

BACKGROUND

Field of the Invention

The present disclosure relates to an imprint method for forming a pattern on an imprint material by bringing a mold and an imprint material on a substrate into contact with each other and curing the imprint material while maintaining the contact.

Description of the Related Art

An imprint technology is known as a technology for producing semiconductor devices and the like. The imprint technology forms a pattern on an imprint material supplied on a substrate, by using a mold on which a corresponding pattern is formed.

In the imprint technology, if foreign particles adhere onto the pattern formed on a mold when the mold and the imprint material are brought into contact, the pattern cannot be accurately formed on the substrate.

Therefore, it is necessary to remove the foreign particles from the mold before forming the pattern on the substrate. Japanese Patent Application Laid-Open No. 2009-266841 discusses an imprint apparatus into which a dummy wafer is carried before forming a pattern on a wafer that is a substrate. In the imprint apparatus, after the imprinting is performed on the dummy wafer, which is carried into the imprint apparatus, and foreign particles is removed from the mold, the dummy wafer is carried out of the imprint apparatus.

However, although foreign particles adhering to the mold is removed by using a dummy wafer as discussed in Japanese Patent Application Laid-Open No. 2009-266841, it is still conceivable that foreign particles may adhere to the mold when a wafer that is not a dummy (i.e., an actual device wafer) is carried into the imprint apparatus after the dummy wafer is carried out of the apparatus. Therefore, in a shot region where a pattern is formed for the first time, there is a risk that the effect of foreign particles may make it impossible to accurately form the pattern.

SUMMARY OF THE INVENTION

Disclosed herein is an imprint method for forming a pattern on a substrate by using a mold includes carrying the substrate into an imprint apparatus, removing, after the substrate is carried into the imprint apparatus, a whole or a portion of foreign particles adhering to a pattern formed on the mold by bringing into contact the mold and an imprint material supplied to a member different from the substrate within the imprint apparatus, and curing the imprint material so as to form the pattern, and forming the pattern on the substrate that has carried into the imprint apparatus, by using the mold from which the foreign particles are removed.

Further features of the present invention will become apparent from the following description of exemplary embodiments with reference to the attached drawings.

DESCRIPTION OF THE EMBODIMENTS

Various exemplary embodiments, features, and aspects of the disclosure will be described in detail below with reference to the drawings. Incidentally, in the drawings, similar members are denoted by substantially the same reference characters, and redundant descriptions will be omitted.

<Imprint Apparatus>

Figure 1:
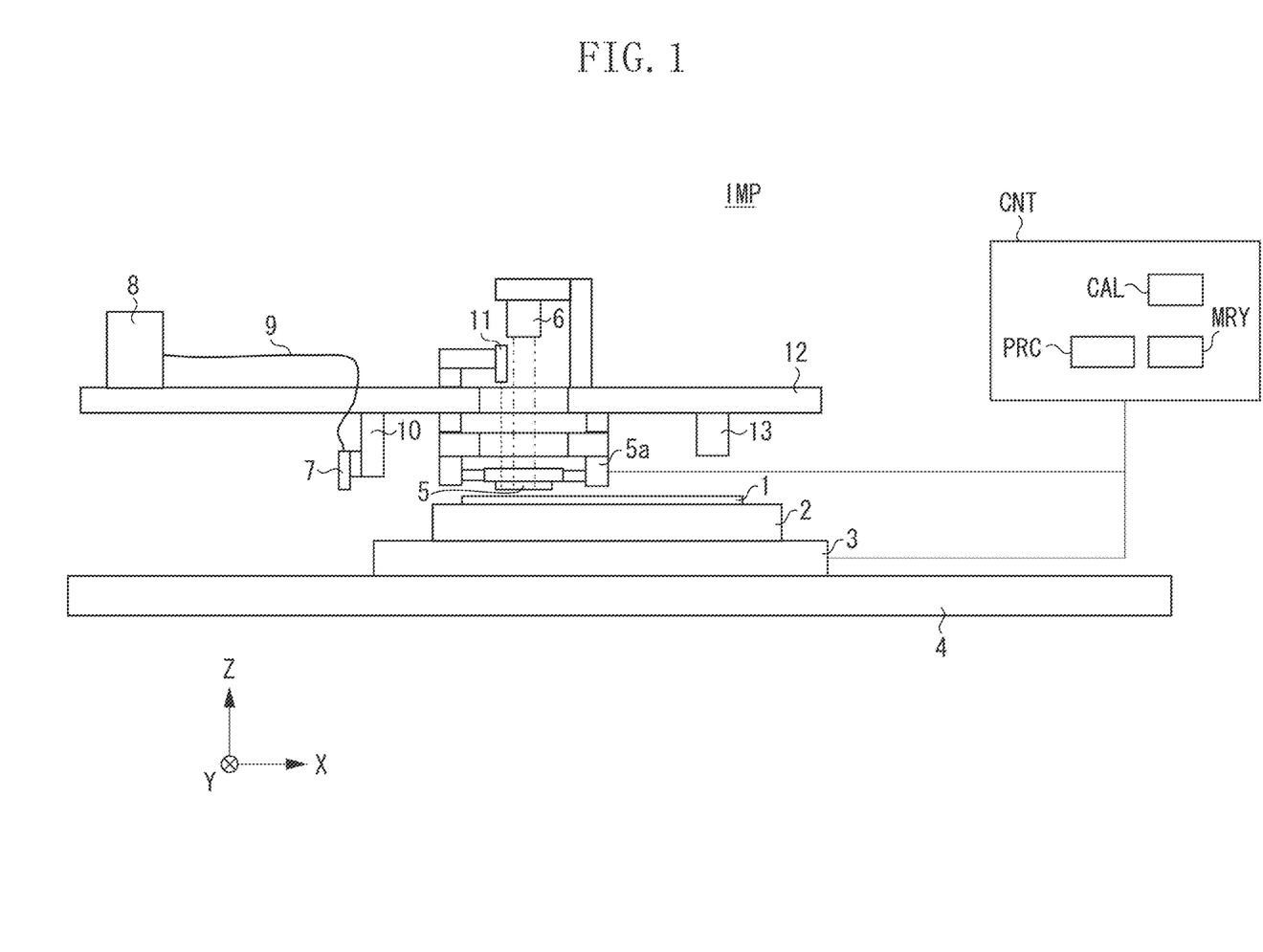
FIG. 1 is a diagram illustrating an imprint apparatus according to a first exemplary embodiment.

With reference to FIG. 1, a construction of an imprint apparatus IMP according to a first exemplary embodiment will be described. Herein, a photo-curing type imprint method in which an imprint material is cured by irradiation with light will be described. More specifically, the method is an imprint method that uses ultraviolet light as the light and an ultraviolet curable resin (resin, resist) as an imprint material.

FIG. 1 illustrates an imprint apparatus IMP according to the first exemplary embodiment. As illustrated in FIG. 1, a Z-axis is defined as lying in a direction in which a mold 5 is pressed against a substrate 1, and an X-axis and Y-axis are respectively defined as lying perpendicularly to the Z-axis and lying in parallel with a plane of the substrate 1 and orthogonally with each other. The imprint apparatus IMP has a substrate chuck 2 (substrate holding unit) that holds a substrate 1 made up of a silicon wafer, a substrate stage 3 that moves while holding the substrate chuck 2, and a base frame 4 that holds and positions the substrate stage 3. As the substrate chuck 2, for example, a vacuum chuck can be used. The substrate stage 3 moves on the base frame 4, in the X-axis and the Y-axis directions.

The imprint apparatus IMP further has a mold holding unit 5a that holds the mold 5 and moves along the Z-axis, a light source 6 that emits ultraviolet light, a supply unit 7 (dispenser) that supplies an imprint material onto the substrate 1, a tank 8 that stores the imprint material, and an alignment scope 11. The alignment scope (detection unit) functions as a detection unit that detects a mark formed on the mold 5 and detects a mark formed on the substrate 1 through the mold 5. As a detection unit, an off-axis scope 13 may be provided for detecting the mark formed on the substrate 1. In this case, the mold 5 is not located between the off-axis scope 13 and the substrate 1. The mold holding unit 5a, the light source 6, the supply unit 7, the tank 8, the alignment scope 11, and the off-axis scope 13 are supported by a surface plate 12.

The mold 5 (i.e., original or template) is provided with a pattern of projections and depressions formed on a surface that faces the substrate 1. The mold 5 is made of a material (quartz, etc.) that transmits ultraviolet light emitted from the light source 6. The portion of the mold 5 where the pattern is formed is herein referred to as a pattern region. As the mold holding unit 5a moves along the Z-axis, the pattern formed on the mold 5 is brought into contact with the imprint material on the substrate 1.

The light source 6 is an ultraviolet generation device. The light source 6 includes an optical element (concave mirror, etc.) that condenses light from the light source in addition to a light source, for example, a halogen lamp that emits i-line light or g-line light, or the like.

The supply unit 7 discharges (supplies) an imprint material in the form of small liquid drops onto the substrate 1. The supply unit 7 is connected to the tank 8 through a pipe 9 so that the imprint material is supplied from the tank 8 to the supply unit 7. Furthermore, a movement unit 10 that moves the supply unit 7 between an imprint material discharge position and a standby position (maintenance position), may be provided. The supply unit 7 is positioned at the discharge position at the time of normal discharge operation, and is moved to the standby position at the time of maintenance. At the standby position, the nozzle of the supply unit 7 is cleaned or replaced.

The alignment scope 11 is a scope for detecting the mark provided on the mold 5 and the mark provided on the substrate 1 after the supply unit 7 supplies the imprint material onto the substrate 1. The imprint apparatus IMP performs alignment of the substrate 1 and the mold 5 by using results of detection of the mark on the mold 5 and the mark on the substrate 1 detected by the alignment scope 11.

<Imprint Cycle>

Figure 2:
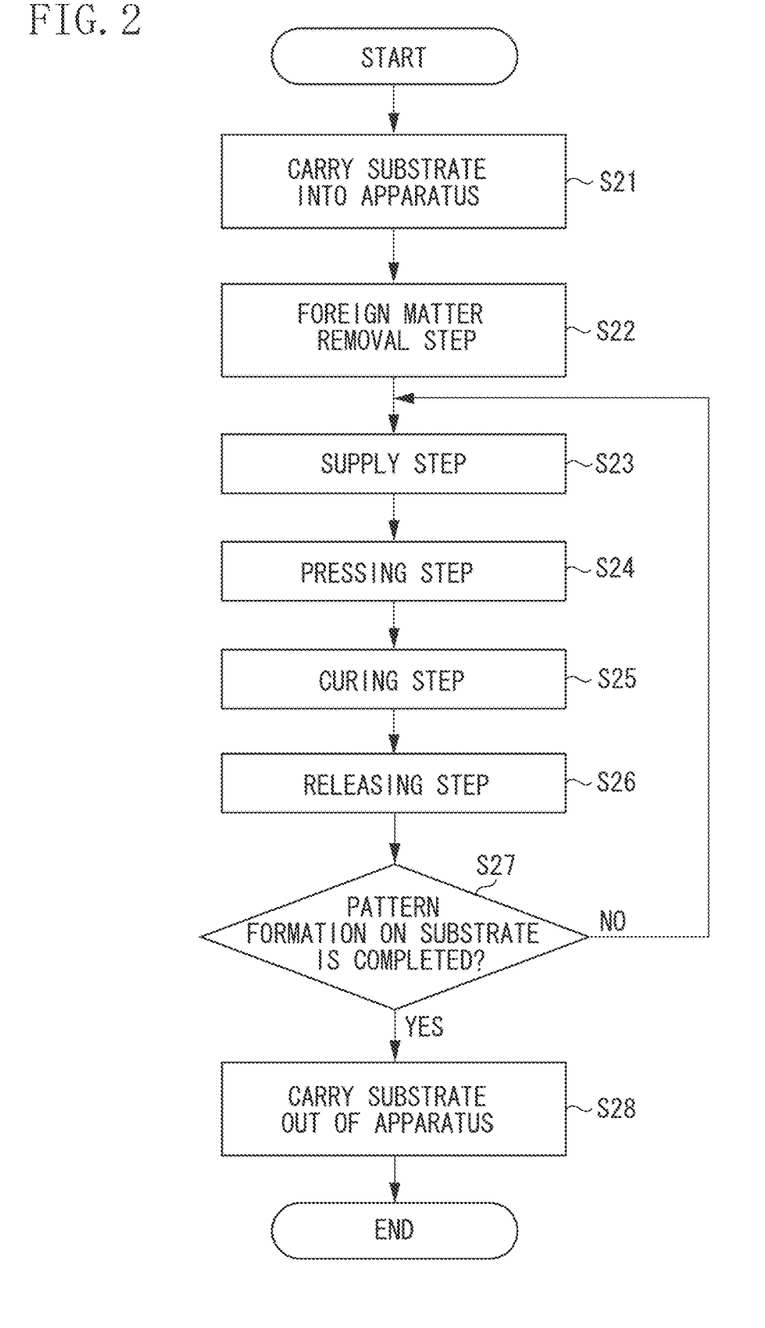
FIG. 2 is a flowchart illustrating a flow of an imprint cycle according to the first exemplary embodiment.

With reference to FIG. 2, an imprint cycle according to the first exemplary embodiment will be described. FIG. 2 is a flowchart illustrating the imprint cycle according to the first exemplary embodiment. The imprint apparatus IMP according to the first exemplary embodiment repeatedly performs the imprint cycle to form patterns in a plurality of shot regions of the substrate 1. The shot regions herein are regions on the substrate 1 each of which receives a pattern transferred from the pattern region formed on the mold 5, by one imprint process. The pattern transferred to a shot region may be the whole or a portion of the pattern region formed on the mold 5. Furthermore, each shot region on the substrate 1 may be provided with or without a pattern formed beforehand by another lithographic apparatus including an imprint apparatus.

Hereinafter, the imprint cycle is assumed to be carried out by the imprint apparatus IMP. The imprint cycle illustrated in FIG. 2 is carried out by executing a program stored in a memory MRY provided in a control unit CNT illustrated in FIG. 1. Furthermore, a processor PRC provided in the control unit CNT processes the programs stored in the memory MRY. Thus, the operation of the imprint cycle according to the present exemplar embodiment is executed according to the programs stored in the memory MRY of the control unit CNT.

In step S21, when the imprint cycle starts, a substrate 1 is carried into the imprint apparatus IMP, and is placed on a transport hand (not illustrated) provided within the imprint apparatus IMP. A substrate transport unit (not illustrated) transports the substrate 1 placed on the transport hand, and places the substrate 1 on the substrate chuck 2. After the substrate 1 is placed on the substrate chuck 2, the off-axis scope 13 detects a plurality of alignment marks formed on the substrate 1. From detection results, the imprint apparatus IMP acquires an arrangement (positions) of a plurality of shot regions on the substrate 1.

There is a possibility of foreign particles adhering to the mold 5 when the substrate 1 is carried into the imprint apparatus IMP and is placed on the substrate chuck 2 by the substrate transport unit in step S21. Therefore, after the substrate 1 is carried into the imprint apparatus IMP, foreign particle removal step S22 described below is performed.

After the foreign particle removal step S22 is performed, the substrate stage 3 is moved to a location under the supply unit 7 in order to supply the imprint material to the first shot region on the substrate 1. Then, in step S23 (supply step), the imprint material is discharged from a discharge port of the supply unit 7, and is supplied onto the substrate 1. In this process, supply of the imprint material and pattern formation (i.e., pressing, curing, and releasing) are repeated for each of the shot regions by moving the substrate 1 while discharging the uncured resin from a discharge port. In the supply step S23, the imprint material may be supplied either to a plurality of shot regions on the substrate or to the entire surface of the substrate by performing the supply step once.

The shot region supplied with the imprint material is moved to a location under the mold 5 provided with a pattern, based on the arrangement of the shot regions acquired at the time of the substrate 1 carried into the imprint apparatus IMP. The relative alignment of the substrate 1 and the mold 5 may be carried out by a global alignment method or a die-by-die alignment method.

After the alignment of the substrate 1 and the mold 5 are completed, the substrate 1 and the mold 5 are brought closer to each other (the space therebetween is reduced) until the imprint material on the substrate 1 and the pattern on the substrate 1 contact each other (contact step). Then, in step S24 (pressing step), the substrate 1 and the mold 5 are pressed against each other to fill the depression portions of the pattern of the mold 5 with the uncured resin.

After the filling of the depression portions of the pattern of the mold 5 with the imprint material is completed, then, in step S25 (curing step), the imprint material is irradiated with ultraviolet light to cure the imprint material while the contact of the mold 5 and the imprint material is maintained.

After the curing of the imprint material is completed, then, in step S26 (releasing step), the space between the substrate 1 and the mold 5 is increased to separate the mold 5 from the cured imprint material. Thus, the formation (transfer) of the pattern onto the substrate 1 is completed. In the releasing step S26, the mold 5 may be separated from the imprint material by driving the mold holding unit 5a or by driving the substrate stage 3. Furthermore, the mold 5 may also be separated from the imprint material by simultaneously or serially driving the mold holding unit 5a and the substrate stage 3.

After the releasing step S26, in step S27, it is determined whether the pattern formation in all the shot regions of the substrate 1 has been completed. If the pattern formation has not been completed in all the shot regions (NO in step S27), the above-described supply step S23 is performed. In the supply step S23, the substrate stage 3 is moved, and the shot region where the pattern is to be formed next is supplied with the imprint material. On the other hand, in a case where the imprint material is supplied to a plurality of shot regions or the entire surface of the substrate 1 beforehand, the processing proceeds to the pressing step S24 without performing the supply step S23.

If it is determined in step S27 that the pattern formation has been completed in all the shot regions on the substrate 1 (YES in step S27), the processing proceeds to step S28. In step S28, the substrate 1 is carried out of the imprint apparatus IMP. In step S28, the substrate transport unit (not illustrated) transports the substrate 1 from the substrate chuck 2 to the outside of the imprint apparatus IMP. Thus, the imprint cycle ends.

With regard to the imprint apparatus IMP, which performs the imprint cycle as described above, it has been found that foreign particles often adhere to the mold 5 while the substrate 1 is carried out of the imprint apparatus and a new substrate is carried into the imprint apparatus. It has been also found that if the above-described imprint cycle is performed without removing foreign particles, due to the foreign particles, accurate pattern corresponding to the mold 5 cannot be formed in the first shot region.

<Dummy Plate on Substrate Stage>

Accordingly, the imprint apparatus IMP according to the first exemplary embodiment, prior to forming the pattern on the substrate 1 carried into the imprint apparatus, performs the foreign particle removal step S22 by using a substrate (dummy plate or member) dedicated to foreign particle removal, which is provided within the imprint apparatus. Hereinafter, the foreign particle removal step S22 for removing foreign particles adhering to the mold 5 will be described.

Figure 3A:
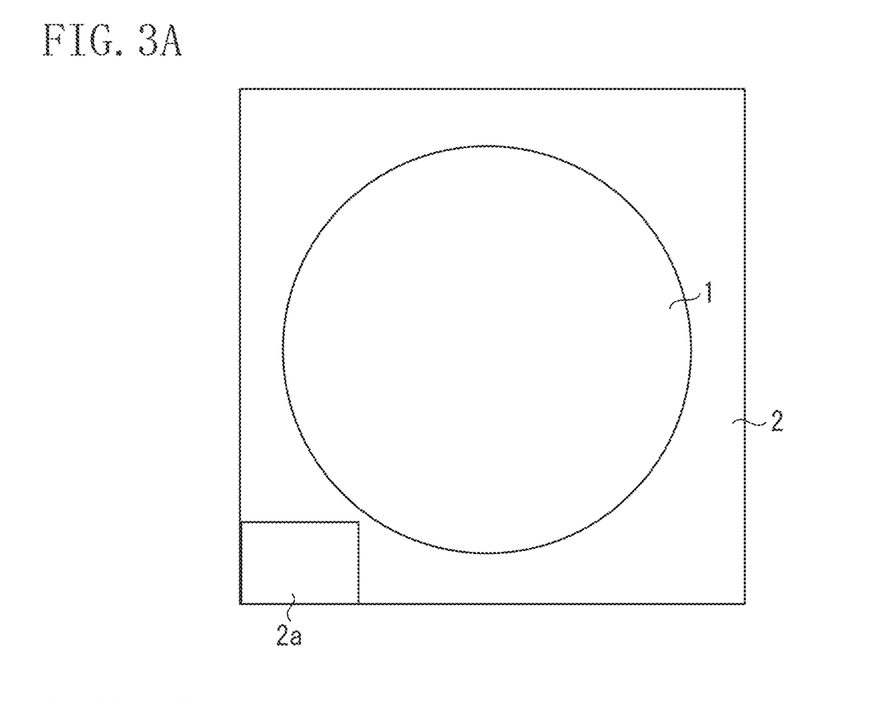
FIGS. 3A, 3B, and 3C are diagrams illustrating a dummy plate according to the first exemplary embodiment.
Figure 3B:
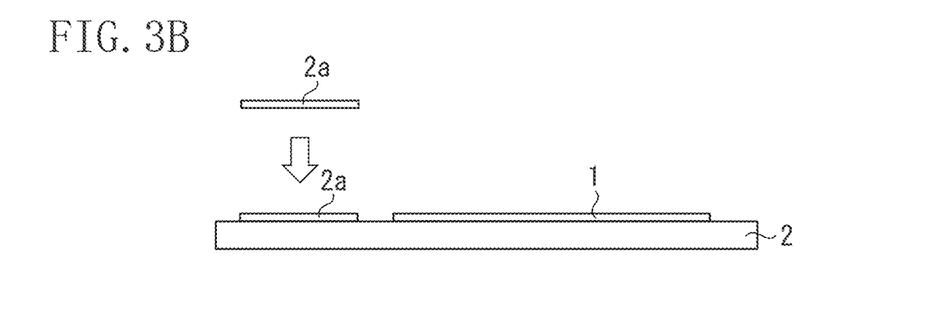
Figure 3C:
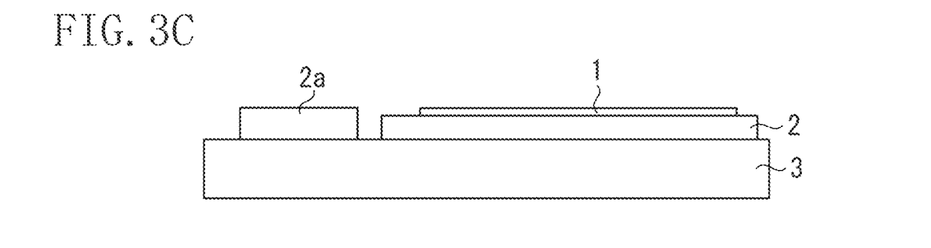

FIGS. 3A, 3B, and 3C illustrate the substrate chuck 2 of the imprint apparatus IMP according to the first exemplary embodiment. FIG. 3A is a top view of the substrate chuck 2 holding the substrate 1. FIG. 3B is a side view of the substrate chuck 2 holding the substrate 1. The substrate chuck 2 is holding a dummy plate 2a as well as the substrate 1. The substrate chuck 2 employed herein may be a vacuum chuck or an electromagnetic chuck. The substrate chuck 2 is capable of holding and fixing the dummy plate 2a by vacuum absorption or electromagnetic force.

The dummy plate 2a may be made of any material as long as the imprint material can be supplied onto the dummy plate and the imprinting can be carried out. If the dummy plate 2a is made of substantially the same material (e.g., single crystal silicon) as the substrate 1, which is a silicon wafer, it is possible to carry out the foreign particle removal step S22 under similar operating conditions to the process steps of the imprinting performed on the substrate 1 described above in conjunction with the imprint cycle with reference to FIG. 2. Furthermore, if the thickness of the dummy plate 2a is substantially the same as the thickness of the substrate 1, the foreign particle removal step S22 can be carried out under similar operating conditions to the process steps of the imprinting performed on the substrate 1.

Furthermore, as illustrated in FIG. 3C, the dummy plate 2a may be provided directly on the substrate stage 3. The foreign particle removal step S22 is performed on a dedicated region (dummy plate 2a) that is provided on the substrate stage 3. If the dummy plate 2a provided on the substrate stage 3 is made of substantially the same material as the substrate 1 and has substantially the same surface height as the substrate 1, the foreign particle removal step S22 can be carried out under similar operating conditions to the steps of the imprinting performed on the substrate 1.

The surface of the dummy plate 2a which faces the mold 5 has a larger area than the area of the pattern formed on the mold 5. The dummy plate 2a illustrated in FIG. 4A has dummy imprint regions 101 and 102 that correspond in size to the region of the pattern formed on the mold 5.

Figure 4A:
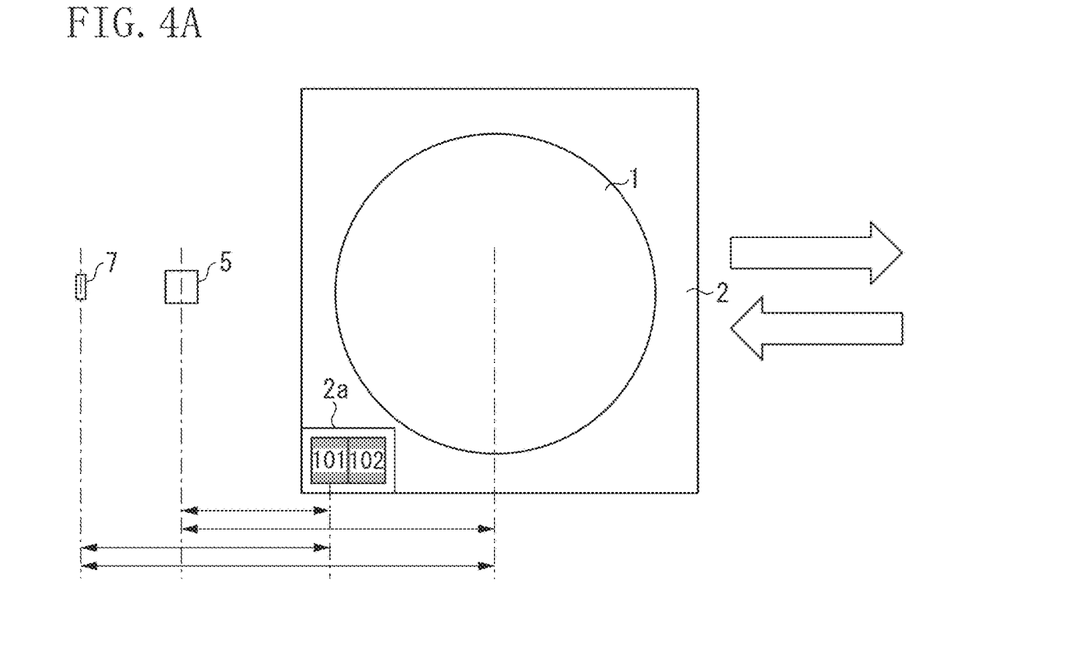
FIGS. 4A and 4B are diagrams illustrating an arrangement of the dummy plate according to the first exemplary embodiment.

FIG. 4A illustrates a position of the substrate chuck 2 (substrate mounting position), a position of the mold 5 (imprint position), and a position of the supply unit 7 (supply position) when the substrate 1 is carried into (or carried out of) the imprint apparatus IMP. It is desirable that the dummy plate 2a is disposed between the position of the mold 5 and the center of the substrate chuck 2 (substrate 1) located when the substrate chuck 2 is positioned at the substrate mounting position. Alternatively, it is desirable that the dummy plate 2a is disposed between the position of the supply unit and the center of the substrate chuck 2 located when the substrate chuck 2 is positioned at the substrate mounting position. By disposing the dummy plate 2a in this manner, the movement distance is reduced when the substrate stage 3 is moved to perform the dummy printing after the substrate 1 is carried into the imprint apparatus IMP. Then, it becomes possible to shorten the time required for the foreign particle removal step, and therefore the productivity of the imprint apparatus IMP is improved.

<Foreign Particle Removal Step>

Next, the foreign particle removal step S22 will be described. If foreign particles adhering to the mold 5 is removed by performing the foreign particle removal step before the substrate 1 is carried into the imprint apparatus IMP, there is a risk that foreign particles may adhere to the mold 5 when (including before and after) the substrate 1 is carried into the imprint apparatus IMP. Therefore, the foreign particle removal step S22 is performed at a predetermined timing after the substrate 1 is carried into the imprint apparatus IMP in step S21. As illustrated in FIG. 3A, in a case where the foreign particle removal step S22 is performed on the dummy plate 2a held by the substrate chuck 2, the dummy plate 2a is carried into the imprint apparatus IMP simultaneously with the conveyance of the substrate 1 thereinto. Alternatively, the dummy plate 2a may be provided in the imprint apparatus IMP before the imprint cycle is started.

The foreign particle removal step S22 is a step of removing the whole or a portion of the foreign particles adhering to the mold 5 by performing the imprinting on the dummy plate 2a. After the substrate 1 is carried into the imprint apparatus IMP in step S21, the imprinting (dummy imprinting) is performed on the dummy plate 2a. The imprinting operations performed on the dummy plate 2a are similar to the imprinting operations (steps S23, S24, S25 and S26) performed on the substrate 1. However, each individual imprinting operation step may be different in order to facilitate removal of the foreign particles adhering to the mold 5. For example, in the supply step of supplying the imprint material to the dummy plate 2a, the dummy plate may be supplied with an imprint material different in viscosity from the imprint material supplied to the substrate 1, or in the pressing step of bringing into contact the mold 5 and the imprint material, the duration of the contact may be changed. Furthermore, in the curing step of curing the imprint material by irradiating the material with ultraviolet light, the ultraviolet irradiation time period may be changed, or the time period required for the releasing step of separating the mold 5 from the cured imprint material may be changed.

Figure 4B:
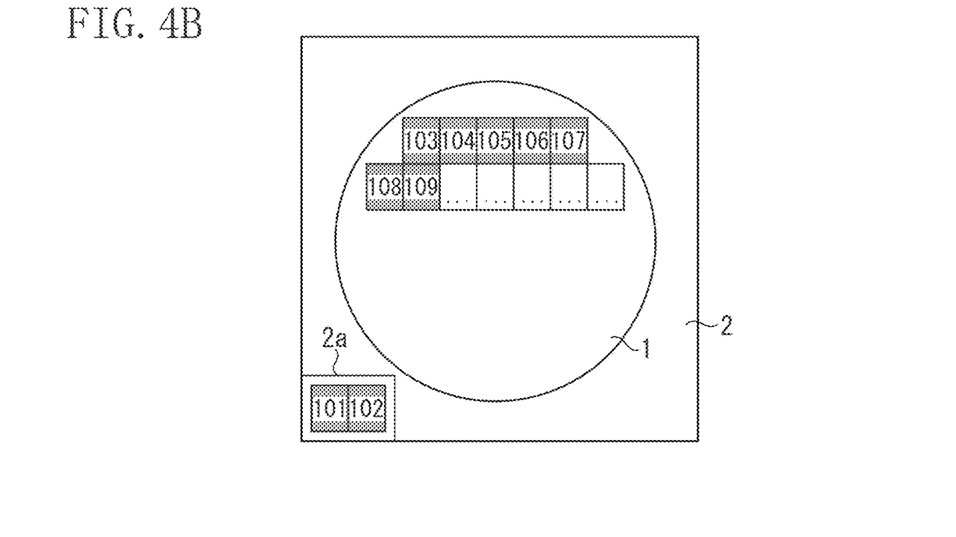

In the foreign particle removal step S22, the imprinting operation is performed at least once on the dummy plate 2a. For example, as illustrated in FIG. 4B, the foreign particle removal step S22 is performed on the dummy imprint regions 101 and 102 on the dummy plate 2a. After that, patterns are formed on the substrate 1 by repeatedly performing the imprinting operations (steps S23, S24, S25 and S26) on the shot regions on the substrate 1 in order, starting with the shot region 103. When all the dummy imprint regions formed on the dummy plate 2a have been used for the foreign particle removal step, the dummy plate 2a is carried out of the imprint apparatus IMP, and a new dummy plate is carried into the imprint apparatus IMP. The dummy plate 2a having been used up for the foreign particles removal step may be restored for reuse by removing the imprint material that has foreign particles adhering thereto or forming a film of the imprint material over the imprint material having foreign particles adhering thereto. Then, the dummy imprinting may be performed on the restored dummy plate 14. Thus, after the foreign particle removal step S22, the patterns can be formed on the substrate 1 without a need to perform a step of carrying the dummy plate 2a out of the imprint apparatus IMP or carrying a substrate (another actual device substrate) into the imprint apparatus IMP. Therefore, decline in the pattern transfer accuracy due to the foreign particles adhering to the mold 5 can be prevented.

The imprint apparatus IMP according to the first exemplary embodiment performs the foreign particle removal step S22 by using the dummy plate 2a held by the substrate chuck 2 or the dummy plate 2a provided directly on the substrate stage 3. An imprint apparatus IMP according to a second exemplary embodiment includes a dummy plate stage 15 (dummy plate holding unit) that holds a dummy plate 14 and moves within the imprint apparatus IMP independently of the substrate stage 3. The imprint apparatus IMP according to the second exemplary embodiment performs the foreign particle removal step S22 by using the dummy plate 14 held on the dummy plate stage 15.

<Dummy Plate>

Figure 5A:
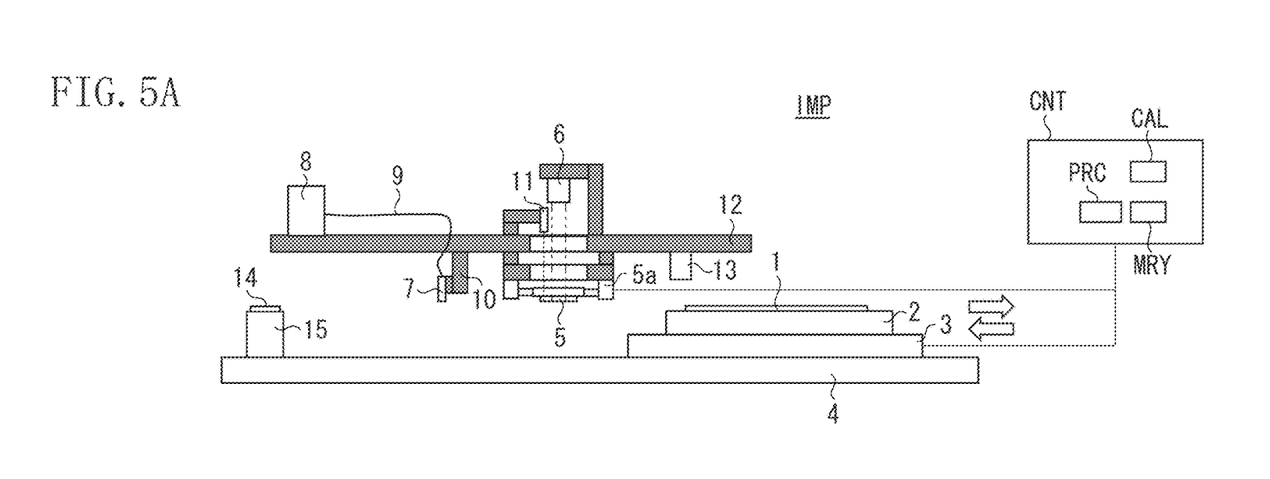
FIGS. 5A and 5B are diagrams illustrating an imprint apparatus according to a second exemplary embodiment.

FIG. 5A illustrates an imprint apparatus IMP including a dummy plate stage 15 that holds a dummy plate 14. The dummy plate 14 is vacuum-absorbed by a vacuum chuck provided on the dummy plate stage 15. The dummy plate 14 may also be held and fixed by, for example, an electromagnetic chuck provided on the dummy plate stage 15, other than the vacuum adsorption. The dummy plate 14 may be made of any material as long as the imprint material can be supplied onto the dummy plate 14 and the imprinting can be performed. If the material of the dummy plate 14 is the same as the material (e.g., single silicon) of the substrate 1, which is a silicon wafer, the foreign particle removal step S22 can be carried out under similar operating conditions to the steps of the imprinting on the substrate 1 described above in conjunction with the imprint cycle illustrated in FIG. 2. Furthermore, if the surface height of the dummy plate 14 is substantially the same as the surface height of the substrate 1, the foreign particles removal step S22 can be carried out under similar conditions to the steps of the imprinting performed on the substrate 1.

<Dummy Imprinting>

The foreign particle removal step S22 according to the second exemplary embodiment will be described with reference to the imprint apparatus IMP illustrated in FIG. 5A. The imprint apparatus IMP according to the second exemplary embodiment carries out the foreign particle removal step S22 after carrying the substrate 1 into the imprint apparatus IMP in step S21 and before forming the pattern on the substrate 1, similarly to the imprint cycle illustrated in FIG. 2.

In the foreign particle removal step S22, the dummy plate stage 15 moves from a standby position of the dummy plate stage 15 to a location under the supply unit 7 (supply position), in order to supply the imprint material to the dummy plate 14. After the imprint material is supplied to the dummy plate 14, the dummy plate stage 15 moves to a location under the mold 5 (imprint position), in order to perform the dummy imprinting on the dummy plate 14.

Figure 6A:
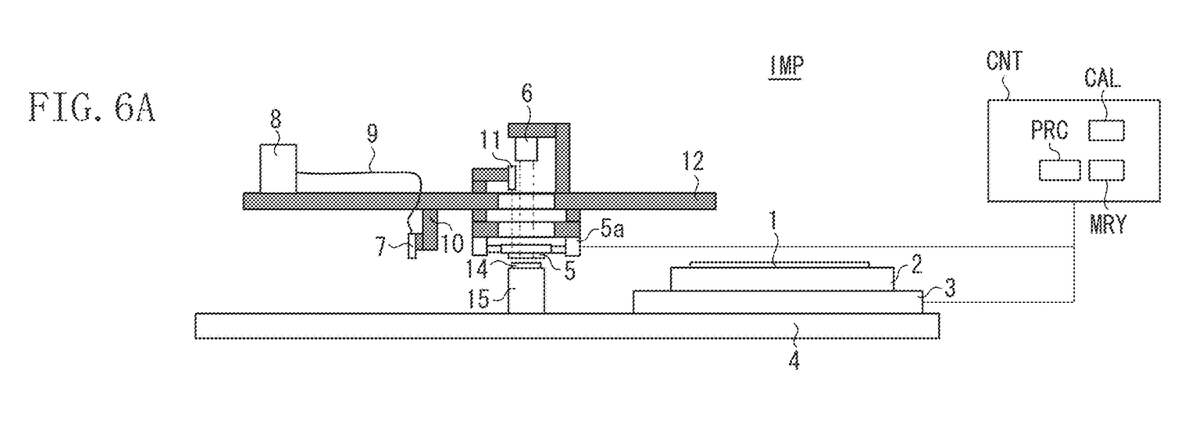
FIGS. 6A and 6B are diagrams illustrating foreign particles removal step according to the second exemplary embodiment.
Figure 6B:
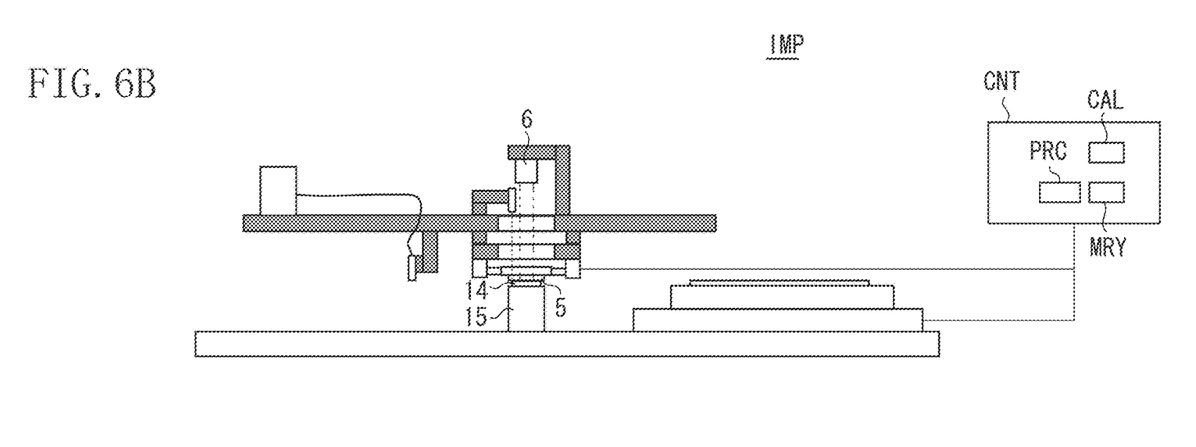
Figure 7A:
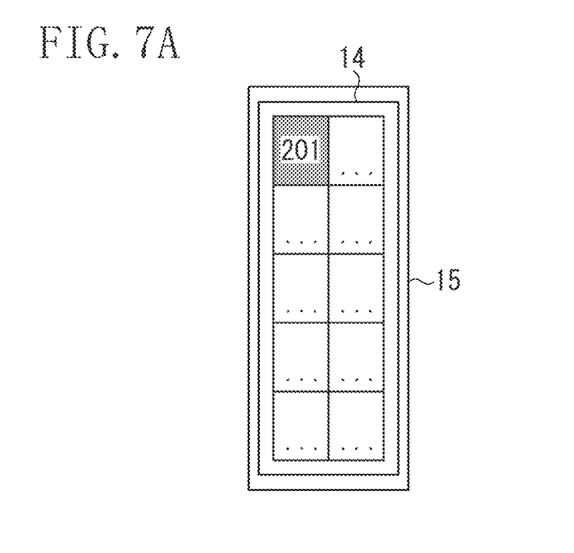
FIGS. 7A and 7B are diagrams illustrating a dummy plate according to the second exemplary embodiment.
Figure 7B:
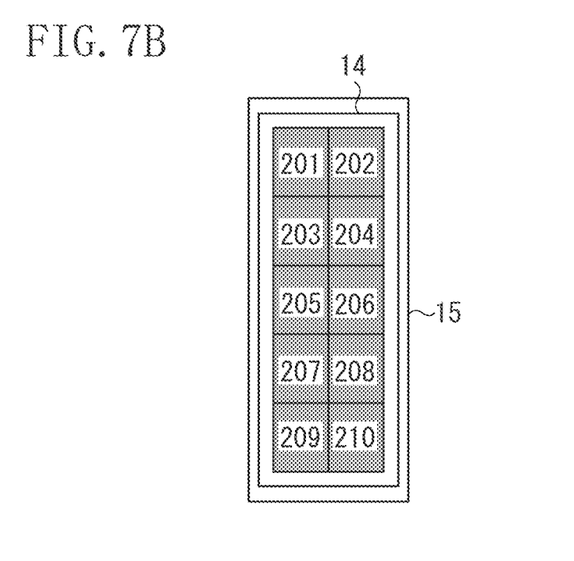

After that, the imprinting is performed on the dummy plate 14 similarly to the dummy imprinting described above in the first exemplary embodiment. FIGS. 6A and 6B illustrate how the dummy imprinting is performed on the dummy plate 14. The dummy plate stage 15 moves the dummy plate 14, which has been supplied with the imprint material, to a location under the mold 5 as illustrated in FIG. 6A, and brings the dummy plate 14 and the mold 5 closer to each other to perform the imprinting as illustrated in FIG. 6B. FIGS. 7A and 7B illustrate the dummy plate 14 held on the dummy plate stage 15. The dummy plate 14 is provided with a plurality of dummy imprint regions 201 to 210. The dummy imprinting in the foreign particle removal step S22 is performed at least once. Therefore, it is not necessary to perform the foreign particle removal step on a single substrate by using all the dummy imprint regions formed on the dummy plate 14. When the dummy imprinting is performed on all the dummy imprint regions formed on the dummy plate 14 as illustrated in FIG. 7B, the dummy plate 14 is carried out of the imprint apparatus and a new dummy plate 14 is carried in. The dummy plate 14 used up for the foreign particle removal step may be restored for reuse by removing from the dummy plate the imprint material having foreign particles adhering thereto, or forming a film of the imprint material over the imprint material having foreign particles adhering thereto. Then, the dummy imprinting may be performed on the restored dummy plate 14.

Figure 5B:
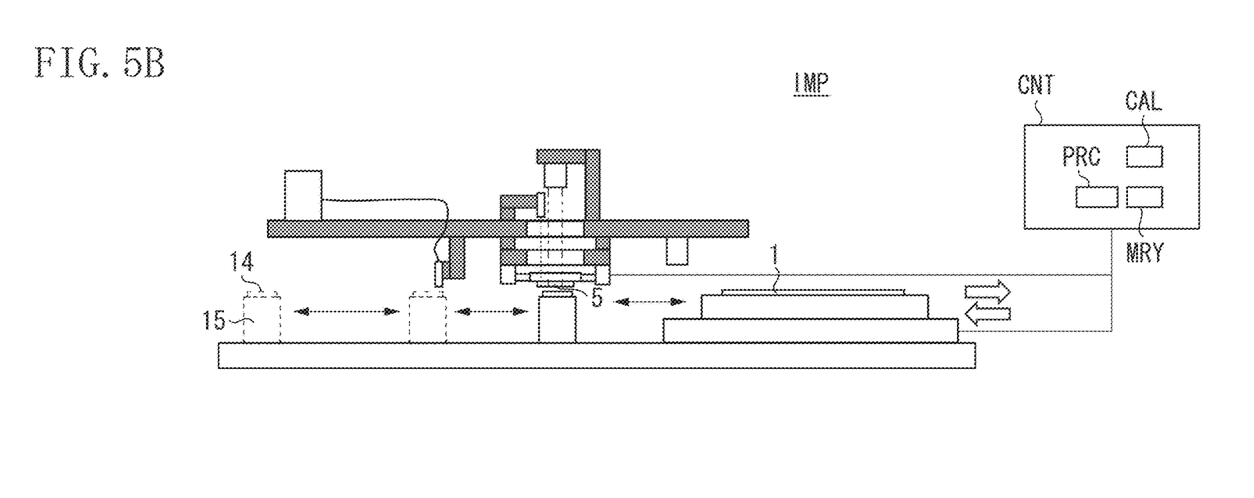

The foreign particle removal step S22 is completed when the dummy plate stage 15 has moved to the standby position after the dummy imprinting. FIG. 5A illustrates a state in which the dummy plate stage 15 is at the standby position. FIG. 5B illustrates how the dummy plate stage 15 moves to the standby position, the supply position, and the imprint position.

FIGS. 5A and 5B illustrate a state where the substrate stage 3 is positioned at the substrate mounting position. The dummy plate stage 15 is configured to be movable between the standby position, the supply position, and the imprint position. As illustrate in FIG. 5, it is desirable that the dummy plate stage 15 is provided on the imprint position side or the supply position side of the substrate stage 3 when the substrate stage 3 is positioned at the substrate mounting position. Furthermore, it is desirable that the standby position of the dummy plate stage 15 is set on the opposite side of the substrate mounting position to the imprint position or the supply position.

Since the dummy plate stage 15 is provided in the imprint apparatus IMP as described above, it is possible to reduce the moving distance of the dummy plate stage 15 to the imprint position and the supply position in the foreign particle removal step S22. The time period required for the foreign particle removal step S22 (dummy imprinting) can be shortened.

The imprint apparatus IMP according to the second exemplary embodiment is capable of moving the stage that holds the substrate 1 and the stage that holds the dummy plate 14 separately from each other. Therefore, simultaneously with the end of the foreign particle removal step performed on the dummy plate 14, the substrate stage 3 can be moved to the supply position in order to carry out the supply step S23. Since the interval between the foreign particle removal step and a step of forming the pattern on the substrate 1 can be shortened, an effect of improving the productivity of the imprint apparatus can be achieved.

Since, as described above, the foreign particle removal step S22 is performed after the substrate 1 is carried into the imprint apparatus IMP, the foreign particles adhering to the mold 5 is removed by the dummy imprinting, so that the influence of foreign particles, when the pattern is formed on the substrate 1, can be reduced.

Other Exemplary Embodiments

In any one of the imprint apparatuses according to the exemplary embodiments described above, ultraviolet light is used to cure the imprint material. However, in the imprint apparatus according to the exemplary embodiments, not only ultraviolet light but also other lights of different wavelengths may be used to cure the resin. Furthermore, the exemplary embodiments may be applied to not only the imprinting apparatuses using a photo-curing method but also imprint apparatuses that cure the imprint material using heat.

In any one of the exemplary embodiments described above, the mold 5 and the imprint material (uncured resin) supplied on the substrate 1 or on the dummy plate 14 can be brought into contact as the mold holding unit 5a moves in a direction of the Z-axis. Furthermore, the mold 5 and the imprint material may also be brought into contact by moving the substrate stage 3 or the dummy plate stage 15 in the Z-axis direction. Alternatively, the mold holding unit 5a and the substrate stage 3 or the dummy plate stage 15 may be simultaneously moved.

<Production Method for Article>

A production method for a device (e.g., a semiconductor integrated circuit device, a liquid crystal display device, and a micro-electro-mechanical system (MEMS)) as an article includes a step of transferring (forming) a pattern to a substrate (e.g., a wafer, a glass plate, a film-shaped substrate) by using the above-described imprinting apparatus. Furthermore, this device production method can include a step of etching the substrate that has a transferred pattern. Furthermore, in a case where another article, such as a patterned medium (recording medium), optical device, and the like, is to be produced, the production method can include a process step of working the substrate provided with a transferred pattern, instead of the etching step. The production method for an article in the present exemplary embodiment is advantageous in at least one of the article's performance, quality, productivity, and production cost, in comparison with the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-261509 filed Dec. 18, 2013, which is hereby incorporated by reference herein in its entirety.

What is claimed is:

1. An imprint method for forming a pattern of an imprint material on a substrate by using a mold, the method comprising:
   carrying the substrate into an imprint apparatus;
   supplying the imprint material by using a supply unit;
   removing, after the substrate is carried into the imprint apparatus, a whole or a portion of foreign particles adhering to a pattern of the mold formed on the mold when bringing an imprint material supplied to a member different from the substrate inside the imprint apparatus and the mold into contact, and curing the imprint material so as to form the pattern of the imprint material on the member; and
   forming the pattern on the substrate that has been carried into the imprint apparatus, by using the mold from which the foreign particles are removed,
   wherein a distance between the member and the supply unit when carrying the substrate into the imprint apparatus is shorter than a distance between the substrate and the supply unit when carrying the substrate into the imprint apparatus.

2. The imprint method according to claim 1, wherein, when foreign particles are removed, the pattern of the mold is formed by bringing the mold and the imprint material supplied onto a dummy plate provided as the member into contact with each other.

3. An imprint method for forming a pattern of an imprint material on a substrate by using a mold, the method comprising:
   carrying the substrate into an imprint apparatus;
   supplying the imprint material by using a supply unit;
   removing, after the substrate is carried into the imprint apparatus, a whole or a portion of foreign particles adhering to a pattern of the mold formed on the mold when bringing an imprint material supplied to a dummy plate which is a member different from the substrate inside the imprint apparatus and the mold into contact, and curing the imprint material so as to form the pattern of the imprint material on the dummy plate; and
   forming the pattern on the substrate that has been carried into the imprint apparatus, by using the mold from which the foreign particles are removed,
   wherein a distance between the dummy plate and the supply unit when carrying the substrate into the imprint apparatus is shorter than a distance between the substrate and the supply unit when carrying the substrate into the imprint apparatus.

4. The imprint method according to claim 3, wherein the removing of foreign particles is performed by using the dummy plate provided between the position of the substrate and the position of the mold when carrying the substrate into the imprint apparatus.

5. The imprint method according to claim 3, wherein the substrate and the dummy plate independently moves when performing the removing of foreign particles.

* * * * *